(12) United States Patent
DeSouza et al.

(10) Patent No.: US 9,722,033 B2
(45) Date of Patent: *Aug. 1, 2017

(54) DOPED ZINC OXIDE AS N+ LAYER FOR SEMICONDUCTOR DEVICES

(71) Applicant: INTERNATIONAL BUSINESS MACHINES CORPORATION, Armonk, NY (US)

(72) Inventors: Joel P. DeSouza, Putnam Valley, NY (US); Keith E. Fogel, Hopewell Junction, NJ (US); Jeehwan Kim, Los Angeles, CA (US); Ko-Tao Lee, White Plains, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/064,190

(22) Filed: Mar. 8, 2016

(65) Prior Publication Data

US 2016/0190260 A1 Jun. 30, 2016

Related U.S. Application Data

(63) Continuation of application No. 14/501,827, filed on Sep. 30, 2014, now Pat. No. 9,324,813.

(51) Int. Cl.
| | |
|---|---|
| *H01L 29/227* | (2006.01) |
| *H01L 29/267* | (2006.01) |
| *H01L 29/66* | (2006.01) |
| *H01L 29/78* | (2006.01) |
| *H01L 29/861* | (2006.01) |
| *H01L 21/02* | (2006.01) |

(Continued)

(52) U.S. Cl.
CPC ...... *H01L 29/227* (2013.01); *H01L 21/02463* (2013.01); *H01L 21/02546* (2013.01); *H01L 21/02554* (2013.01); *H01L 21/02576* (2013.01); *H01L 21/465* (2013.01); *H01L 21/477* (2013.01); *H01L 29/267* (2013.01); *H01L 29/66969* (2013.01); *H01L 29/78* (2013.01); *H01L 29/7848* (2013.01); *H01L 29/861* (2013.01); *H01L 29/8611* (2013.01)

(58) Field of Classification Search
CPC ......... H01L 33/32; H01L 33/40; H01L 33/28; H01S 5/32341
USPC ........................ 257/96, 102, 22, 99, 103, 15
See application file for complete search history.

(56) References Cited

U.S. PATENT DOCUMENTS

| | | | |
|---|---|---|---|
| 5,889,295 A * | 3/1999 | Rennie ............. | H01L 33/28 257/102 |
| 9,324,813 B2 * | 4/2016 | DeSouza .......... | H01L 29/267 |

(Continued)

OTHER PUBLICATIONS

List of IBM Patents or Patent Applications Treated as Related dated Mar. 8, 2016. (2 Pages).

*Primary Examiner* — Benjamin Sandvik
*Assistant Examiner* — Changhyun Yi
(74) *Attorney, Agent, or Firm* — Tutunjian & Bitetto, P.C.; Louis J. Percello

(57) ABSTRACT

A semiconductor device includes a substrate and a p-doped layer including a doped III-V material on the substrate. An n-type layer is formed on or in the p-doped layer. The n-type layer includes ZnO on the p-doped layer to form an electronic device.

18 Claims, 7 Drawing Sheets

(51) Int. Cl.
*H01L 21/477* (2006.01)
*H01L 21/465* (2006.01)

(56) References Cited

U.S. PATENT DOCUMENTS

| | | | |
|---|---|---|---|
| 2007/0163635 A1* | 7/2007 | Nasuno | H01L 31/068 136/252 |
| 2013/0095606 A1* | 4/2013 | Bayraktaroglu | H01L 29/7869 438/104 |
| 2014/0203826 A1* | 7/2014 | Evans | H01L 29/24 324/693 |

* cited by examiner

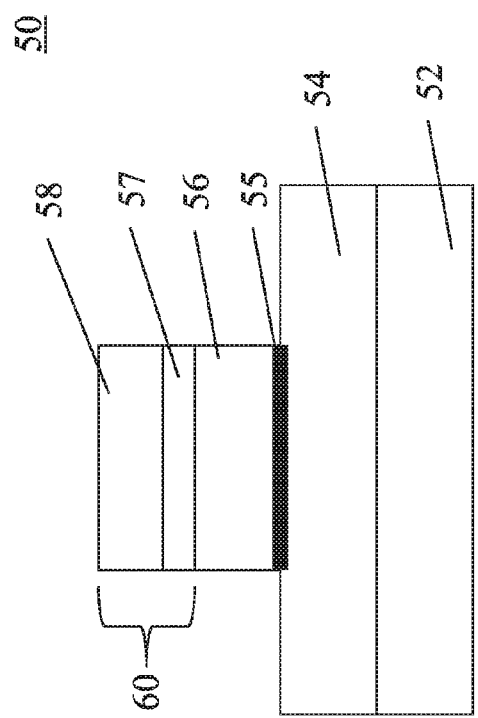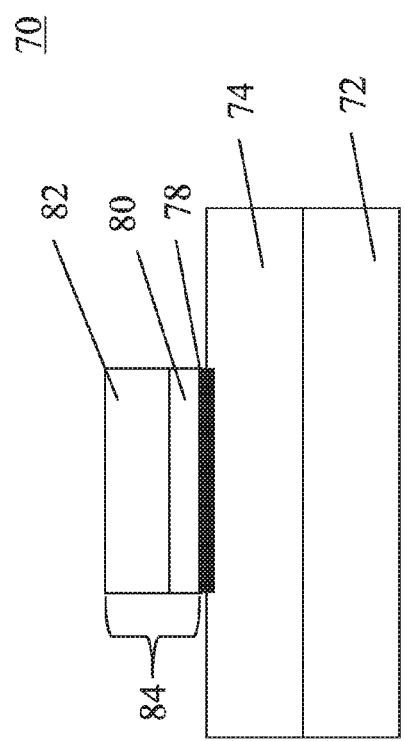
FIG. 3
FIG. 4

US 9,722,033 B2

DOPED ZINC OXIDE AS N+ LAYER FOR SEMICONDUCTOR DEVICES

RELATED APPLICATION DATA

This application is a Continuation application of co-pending U.S. patent application Ser. No. 14/501,827 filed on Sep. 30, 2014, incorporated herein by reference in its entirety.

BACKGROUND

Technical Field

The present invention relates to semiconductor devices and processes, and more particularly to semiconductor devices that employ doped ZnO instead of InGaAs for n+ layers in such devices.

Description of the Related Art

Field effect transistors (FETs) which employ III-V materials, such as GaAs, InP or InGaAs substrates, often include a doped source and drain region made of a similar material. In one common structure, III-V FETs include source/drain (S/D) regions formed from doped InGaAs (e.g., n+ InGaAs). n+ InGaAs is not ideal for S/D regions. In InGaAs nFETs, the n+ InGaAs S/D regions suffer from a low doping concentration (e.g., $1 \times 10^{19}$ cm$^{-3}$). In addition, there is relatively high junction leakage and high contact resistance in InGaAs S/D regions. Further, the formation process requires patterned implantation of n+ dopants, which adds time and expense to the process, and may result in junction damage.

SUMMARY

A semiconductor device includes a substrate and a p-doped layer including a doped III-V material on the substrate. An n-type layer is formed on or in the p-doped layer. The n-type layer includes ZnO and forms an electronic device.

A semiconductor device includes a III-V substrate and a p-doped layer including a doped III-V material on the substrate. An n-type layer is formed on or in the p-doped layer. The n-type layer includes ZnO deposited or epitaxially grown on the p-doped layer to form an electronic device.

A semiconductor device includes a substrate and a p-doped layer including a doped III-V material on the substrate. A doped ZnO is formed as an n-type layer on or in the p-doped layer to form an electronic device, wherein the n-type layer includes a carrier concentration of between about $1 \times 10^{21}$ cm$^{-3}$ to about $5 \times 10^{21}$ cm$^{-3}$.

A method for forming a semiconductor device includes growing a p-doped layer including a doped III-V material on a substrate; forming an n-type layer including ZnO on or in the p-doped layer; and processing the n-type layer to form a device.

Another method for forming a semiconductor device includes growing a p-doped layer including a doped III-V material on a substrate; depositing an n-type layer including ZnO formed on the p-doped layer by employing an atomic layer deposition process or metal organic chemical vapor deposition process; and patterning the n-type layer to form a device.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 3 is a cross-sectional view of a partially fabricated diode with a ZnO n-type layer forming a junction in accordance with the present principles;

FIG. 4 is a cross-sectional view of another partially fabricated diode with a n-type layer including ZnO forming a junction and interface layer in accordance with the present principles;

DETAILED DESCRIPTION OF PREFERRED EMBODIMENTS

Figure 1:
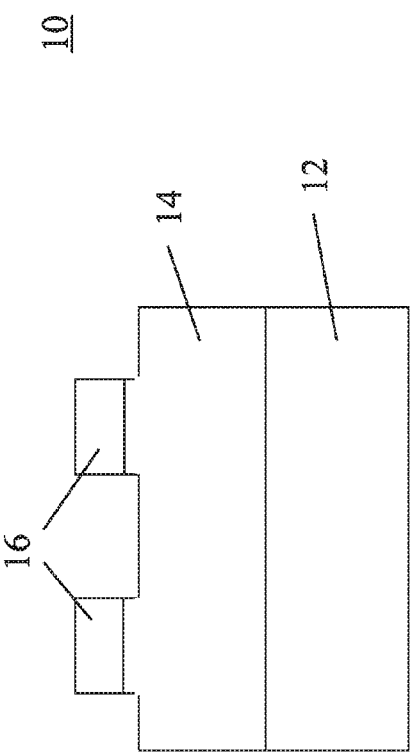
FIG. 1 is a cross-sectional view of a partially fabricated field effect transistor with a ZnO n-type layer forming source and drain regions in accordance with the present principles.

In accordance with the present principles, electronic devices, structures and methods for formation are described for replacing n-doped semiconductor materials with doped ZnO. Doped ZnO, and in particular, n+ Al-doped ZnO (ZnO:Al or AZO) provides a replacement material for source and drain regions or active layers in diodes, etc. ZnO:Al has a similar electron affinity (~4.35-~4.4 eV) as n+ InGaAs, which is ~4.5 eV. ZnO:Al has a greater doping level that can be obtained, for example, up to about $5 \times 10^{21}$/cm$^3$. ZnO:Al processing is more compatible with metallization processing. For example, S/D regions may include metal layers formed thereon. ZnO:Al is more compatible with the metal material employed in forming these structures.

The formation of ZnO:Al also tends to be easier. For example, instead of epitaxial growth processes with patterned doping (e.g., for n+ InGaAs), ZnO:Al may be formed using atomic layer deposition (ALD), although other processes may be employed. This permits a doped layer with less surface damage. Materials like Al may be formed directly on the ZnO and be annealed to cause diffusion of the Al to dope the ZnO.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip in accordance with the present principles may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., InP, InGaAs or ZnO. These compounds may include different proportions of the elements within the compound, e.g., InGaAs includes $In_xGa_{1-x}As$, where x is less than or equal to 1, or ZnO includes $Zn_xO_{1-x}$ where x is less than or equal to 1, etc. In addition, other elements may be included in the compound, such as, e.g., ZnO:Al, and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a cross-section of a partially fabricated field effect transistor (FET) 10 is shown in accordance with one illustrative example. The FET 10 includes a substrate 12, a p-doped layer 14 and n-type source and drain regions 16. While the structures described and shown in accordance with the present principles are particularly useful for n-FETs, doping changes and materials may be adjusted to implement the present principles in p-FET devices as well. In one embodiment, the substrate 12 may include a III-V wafer, silicon material or other suitable material or wafer. Some embodiments implement a III-V material (e.g., for the p-doped layer 14 and/or the n-type layer 16) grown on a Si substrate 12, as this structure tends to have an extremely high leakage due to dislocations due to the different structures of the materials. Such an embodiment would benefit from the reduced leakage achieved in accordance with the present principles.

The p-doped layer 14 may include a p-doped InGaAs layer although other III-V materials may be employed. In conventional devices, the source/drain (S/D) regions would normally include regrown III-V materials formed using epitaxy with patterned doped regions by implantation processes.

In accordance with useful embodiments, a II-VI material may be employed for S/D regions 16. In particular, an n-type material, such as, ZnO or its alloys may be employed. ZnO can be generically applied to III-V materials with matching work functions. n-type layer 16 has a preferred band gap of about 1 eV or less. While the ZnO can be employed to replace, InGaAs or other III-V materials, ZnO can be employed for the semiconductor materials whose band gap is less than 1 eV, e.g., on Ge or similar materials.

A range of n-doping in ZnO is up to 2 atomic percent (e.g., ~$5 \times 10^{21}/cm^3$). ZnO dopants may include Al, B, Ga, In, etc, with Al:ZnO being preferred. ZnO may be deposited or grown by one or more of the following processes, epitaxy, sputtering, atomic layer deposition (ALD) and metal organic chemical vapor deposition (MOCVD). The ZnO preferably includes n+ ZnO:Al deposited by atomic layer deposition ALD. The ALD process forms the S/D regions 16 to provide less surface damage to underlying layers including layer 14. In addition, higher doping concentrations for the S/D regions can be achieved with better stoichiometric control. In one example, the ALD process may include the use of a 13 cycle Zn deposition to 1 cycle Al deposition. The carrier concentration (electron density) of the S/D regions may be between about $1\times10^{21}$ cm$^{-3}$ to about $5\times10^{21}$ cm$^{-3}$, and preferably about $3.0\times10^{21}$ cm$^{-3}$ for doped Aluminum Zinc Oxide (ZnO:Al) (AZO).

The n-type material 16 (e.g., ZnO:Al) is preferably crystalline in form. This includes a monocrystalline structure and may include a multi-crystal structure or other crystalline structure (micro, nano, etc.). However, the AZO material of layer 16 may also include amorphous phases. In one embodiment, the ZnO of layer 16 is amorphous. The underlying layers, e.g., p-doped layer 14 and substrate 12 are also preferably crystalline, but may include other phases.

Figure 2:
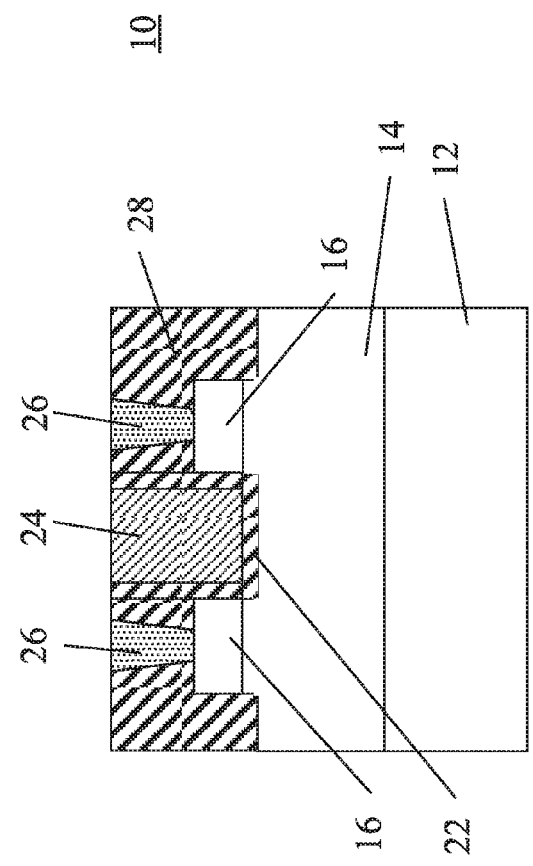
FIG. 2 is a cross-sectional view of the partially fabricated field effect transistor of FIG. 1 with an illustrative gate structure formed in accordance with the present principles.

Referring to FIG. 2, the FET 10 is further processed by forming a gate dielectric 22, e.g., HfO$_2$, Al$_2$O$_3$, or other high dielectric constant material, and/or insulating layers. A gate electrode 24 is then formed. The gate electrode 24 may include any suitable highly conductive material, e.g., Cu, Cr, Au, Ag, etc. Contacts 26 are also formed on the S/D regions 16 through a dielectric material 28. The contacts 26 may include a wider range of materials over conventional devices, that is, more compatible materials are available for use as contact metals. For example, the FET 10 may include metal contacts in a bi-layer of, e.g., Al and Au. An Al liner may be placed on the S/D regions 16 followed by a highly conductive material such as Au or Pt. Other metals or combinations of metals are also contemplated. The Al (or other metal layer) may be employed as a dopant source for doping or further doping the underlying S/D regions 16. An anneal process may be performed to assist in doping the S/D regions 16 with contact metals.

Current-voltage (I-V) graphs of device current (amps) versus device gate voltage (volts) have compared a device that includes n+ InGaAs S/D regions in accordance with a conventional FET and a device that includes n+ ZnO:Al S/D regions for a FET in accordance with the present principles. n+ ZnO:Al devices provide a greater current (electron density) than for n+ InGaAs for positive voltages and comparable for negative voltages. The greater current density in ZnO:Al provides better device performance.

The replacement of a doped III-V material layer with a metal oxide semiconductor may be included in other electronic devices as well. For example, a diode may be provided having a doped layer of AZO or indium tin oxide (ITO) as shown in FIGS. 3 and 4. In useful embodiments, AZO is employed to replace n-InGaAs, since AZO has 1-2 order of magnitude higher n-doping than InGaAs, thus saturation current is less in reverse bias. AZO has a high band gap so breakdown voltage of an AZO/InGaAs n-p junction in reverse bias is substantially higher than in an InGaAs n/p junction. AZO and InGaAs both have less source- (or drain) to-substrate junction leakage in InGaAs FETs. Higher current in forward bias is also observed, but the reduced junction leakage is a dominant feature in accordance with the present principles.

Referring to FIG. 3, a cross-section of a diode 50 is shown in accordance with one illustrative example. The diode 50 includes a substrate 52, a p-doped layer 54 and n-type layer 56. While the structure described and shown in accordance with the present principles is particularly useful for n-type diodes, doping changes and materials may be adjusted to implement the present principles in p-type devices as well. In one embodiment, the substrate 52 may include a III-V material, such as InP, although a Si wafer or substrate may also be employed, as well as other materials. The p-doped layer 54 may include a p-doped InGaAs layer although other III-V materials may be employed. In one embodiment, the p-doped layer includes In$_{0.53}$Ga$_{0.47}$As.

In accordance with useful embodiments, a II-VI material may be employed for n-type layer 56. In particular, ZnO or ITO may be employed. The ZnO preferably includes n+ ZnO:Al deposited by atomic layer deposition ALD, although other formation processes may be employed, e.g., MOCVD, sputtering, epitaxy, etc. The ALD process forms the layer 56 to provide less surface damage to underlying layers including layer 54. In addition, higher doping concentrations for the layer 56 can be achieved with better stoichiometric control. In one example, the ALD process may include the use of a 13 cycle Zn deposition to 1 cycle Al deposition. The carrier concentration (electron density) of the layer 56 may be between about $1\times10^{21}$ cm$^{-3}$ to about $5\times10^{21}$ cm$^{-3}$, and preferably about $3.0\times10^{21}$ cm$^{-3}$ for doped Aluminum Zinc Oxide (ZnO:Al) (AZO). The layer 56 may include a thickness of between about 5 nm and 50 nm, with a thickness of about 30 nm being preferred.

In one embodiment, an interface layer 55 may be formed and configured to transition an energy gap between the n-type layer 56 and the p-doped layer 54. The interface layer 55 acts as a buffer to reduce the formation of a Schottky barrier between the adjacent materials. The interface layer 55 is configured to transition an energy gap between the n-type layer 56 and the p-doped layer 54.

The interface layer or transition layer 55 reduces diode leakage by a significant amount. Interface layer 55 is an interlayer formed between layer 56 (e.g., ZnO:Al) and layer 54 (e.g., InGaAs). The interface layer 55 may be heavily n-doped ZnO with In, Ga, Al dopants or a heavily n-doped InGaZnO compound. In one embodiment, layer 56 can be removed and the diode 50 formed with the interface layer 55 and layer 54 forming the diode junction. (See FIG. 4).

The n-type material 56 (e.g., ZnO:Al) and interface layer 55 are preferably crystalline in form. This includes a monocrystalline structure and may include a multi-crystal structure or other crystalline structure (micro, nano, etc.). However, the AZO material of layer 56 (and layer 55) may also include amorphous phases. In one embodiment, the ZnO of layer 56 is amorphous. The underlying layers, e.g., p-doped layer 14 and substrate 12 are also preferably crystalline, but may include other phases.

A contact 60 is formed on layer 56. The contact 60 may include a wider range of materials over conventional devices due to the use of materials in layer 56. For example, the diode 50 may include metal contacts in a bi-layer structure (e.g., layers 57 and 58) which may include, e.g., Al and Au, respectively. An Al liner may be placed on the layer 56 followed by a highly conductive material such as Au or Pt. Other metals or combinations of metals are also contemplated. The Al of contact 60 may be employed to dope ZnO. The Al can increase the doping in AZO by annealing.

The interface layer 55 may form and include a combination of materials from adjacent layers. For example, the n-type layer 56 may include ZnO, ITO, etc. and preferably n+ ZnO:Al deposited by atomic layer deposition ALD or other process, e.g., MOCVD, sputtering, epitaxy, etc. Interface layer 55 may include InGaZnO and be formed by diffusion (e.g., annealing). The interface layer 55 may include a thickness of between about 1 nm to about 30 nm.

Referring to FIG. 4, a cross-section of another diode 70 is shown in accordance with another illustrative example. The diode 70 includes a substrate 72, a p-doped layer 74 and n-type layer 78. While the structure described and shown in accordance with the present principles is particularly useful for n-type diodes, doping changes and materials may be adjusted to implement the present principles in p-type devices as well. In one embodiment, the substrate 72 may include III-V materials, such as InP, Si or other suitable materials. The p-doped layer 74 may include a p-doped InGaAs layer although other III-V materials may be employed.

In accordance with useful embodiments, a II-VI material may be employed for n-type layer 78, which may be employed to form an interface layer. The interface layer may include a combination of materials from adjacent layers. For example, in one embodiment, an n-type material may be deposited on layer 74 and may include ZnO, ITO, etc. and preferably n+ ZnO:Al deposited by atomic layer deposition ALD or other process, e.g., MOCVD, sputtering, epitaxy, etc. The deposited n-type material may include a thickness of about 100 nm. The interface layer 78 may include InGaZnO and be formed by etching back the ZnO layer (not shown) on the InGaAs of layer 74. The n-type layer (interface layer) 78 may include a thickness of between about 1 nm to about 30 nm.

A contact 84 is formed on layer 78. The contact 84 may include a wider range of materials over conventional devices due to the materials in layer 78. For example, the diode 70 may include metal contacts in a bi-layer structure (e.g., layers 80 and 82), which may include, e.g., Al and Au, respectively. An Al liner may be placed on the layer 78 followed by a highly conductive material such as Au or Pt. Other metals or combinations of metals are also contemplated.

Figure 5:
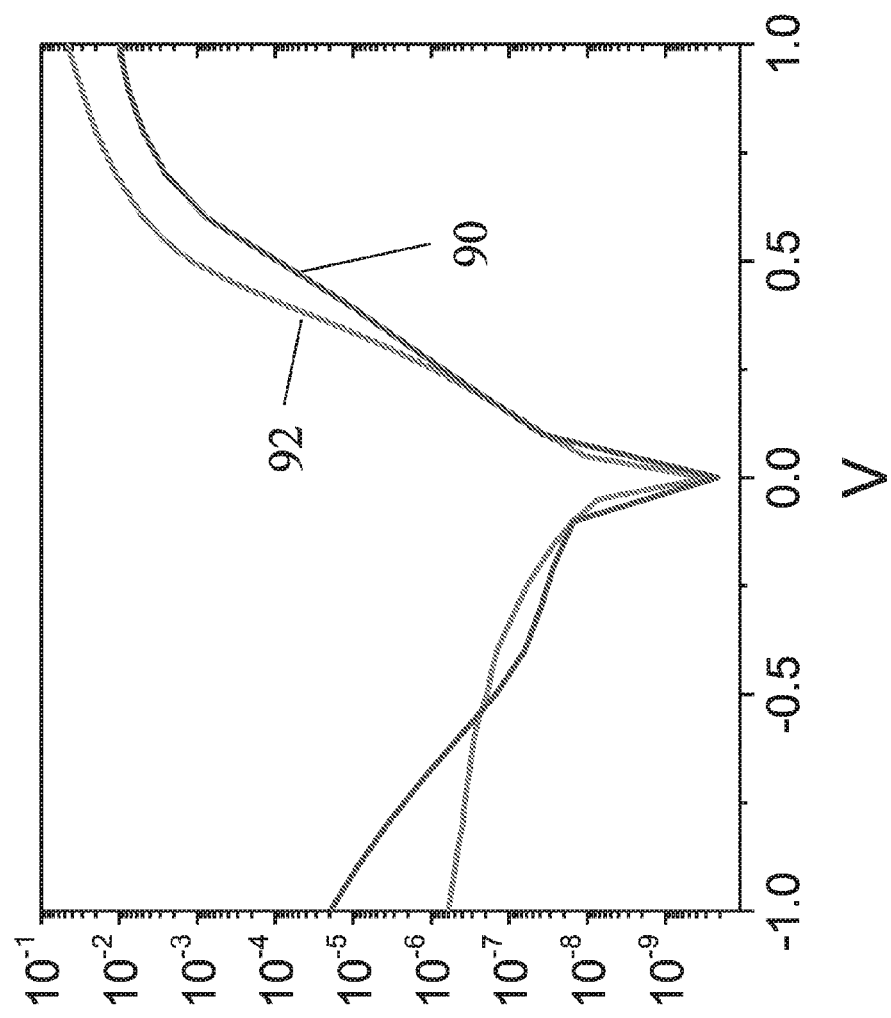
FIG. 5 is a current-voltage (I-V) graph plotting device current (amps) versus device voltage (volts) for a diode of FIG. 3 that includes n+ InGaAs and a diode of FIG. 3 that includes n+ ZnO:Al in accordance with the present principles.

Referring to FIG. 5, a current-voltage (I-V) graph plots device current (amps) versus device voltage (volts) for two devices. One plot 90 corresponds to a device that includes 30 nm of n+ InGaAs (specifically $In_{0.53}Ga_{0.47}As$) used for the n-doped layer in accordance with a conventional diode. Another plot 92 corresponds to a device that includes 30 nm of n+ ZnO:Al in accordance with the structure of FIG. 3 for the present principles. As seen in the graph, plot 92 for n+ ZnO:Al provides a greater current (electron density) than the plot 90 for n+ InGaAs for positive voltages and for reverse voltages. An order of magnitude lower saturation current is achieved which reduces leakage current in FETs by the same order of magnitude.

Also, in the reverse bias, an InGaAs n/p junction starts breaking down near 0.5 V while an AZO/InGaAs n/p junction (present principles) does not break down. This is because the ZnO band gap of 3.5 eV is much higher than the band gap of InGaAs. The substantially reduced reverse leakage current provides better device performance. Plot 92 provides an on/off ratio of $1 \times 10^6$. The on/off ratio of the device of plot 92 is improved by 3-4 orders of magnitude over that of the device for plot 90.

The on/off ratio provides an indication of leakage current and may be defined as the current at 1 V divided by the current at −1 V. Devices in accordance with the present principles have an on/off ratio of $>1 \times 10^6$ while a conventional device with n+ InGaAs/p− InGaAs has an on/off ratio of $\sim 1 \times 10^3$.

Figure 6:
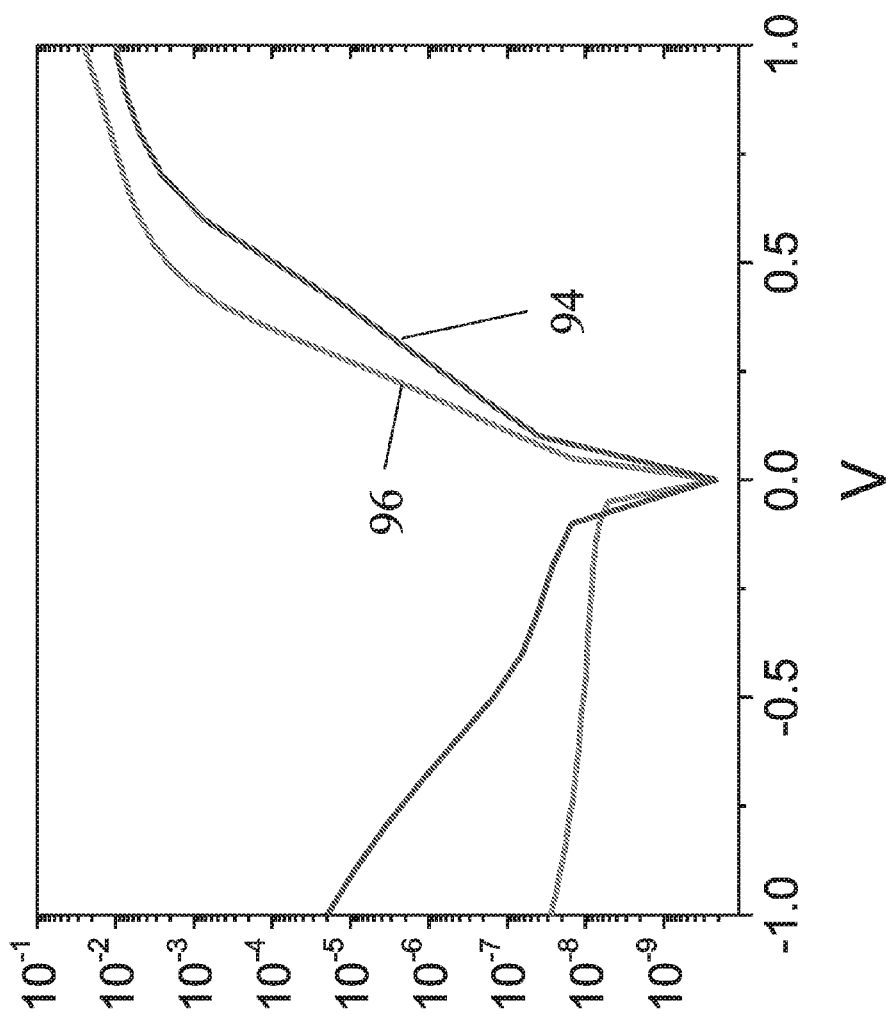
FIG. 6 is a current-voltage (I-V) graph plotting device current (amps) versus device voltage (volts) for a diode of FIG. 3 that includes n+ InGaAs and a diode of FIG. 3 that includes n+ ZnO:Al, both devices were subject to an anneal process of at 300 degrees C. for 30 seconds in accordance with present embodiments.

Referring to FIG. 6, a current-voltage (I-V) graph plots device current (amps) versus device voltage (volts) for two devices. One plot 94 corresponds to a device that includes 30 nm of n+ InGaAs (specifically $In_{0.53}Ga_{0.47}As$) used for the n-doped layer in accordance with a conventional diode. Another plot 96 corresponds to a device that includes 30 nm of n+ ZnO:Al in accordance with the structure of FIG. 3 for the present principles. Both devices were subject to a rapid thermal anneal process at 300 degrees C. for 30 seconds. As seen in the graph, plot 96 for n+ ZnO:Al provides a greater current (electron density) than the plot 94 for n+ InGaAs for positive voltages. The greater current density in ZnO:Al provides better device performance. Plot 96 provides an on/off ratio of about $1 \times 10^6$. The on/off ratio of the device of plot 96 is improved by 3-4 orders of magnitude over that of device for plot 94.

As before, for positive voltages and reverse voltages, an order of magnitude lower saturation current is achieved, which reduces leakage current in FETs by the same order of magnitude. Also in the reverse bias, an InGaAs n/p junction starts breaking down near 0.5 V while an AZO/InGaAs n/p junction (present principles) does not break down. This is because the ZnO band gap of 3.5 eV is much higher than the band gap of InGaAs. The substantially reduced reverse current provides better device performance.

Figure 7:
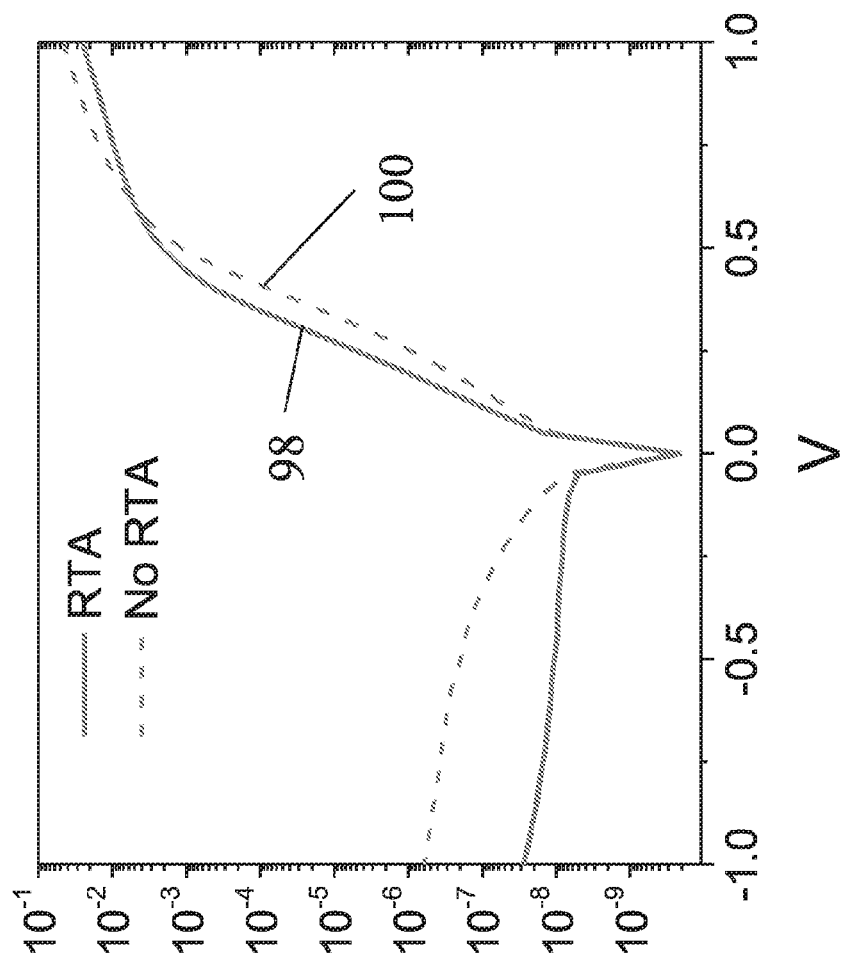
FIG. 7 is a current-voltage (I-V) graph plotting device current (amps) versus device voltage (volts) for diodes of FIG. 3 that include n+ ZnO:Al, where one device was subjected to an anneal process of at 300 degrees C. for 30 seconds and the other device was not in accordance with present embodiments.

Referring to FIG. 7, a current-voltage (I-V) graph plots device current (amps) versus device gate voltage (volts) for two devices. One plot 98 corresponds to a device that includes 30 nm of n+ ZnO:Al in accordance with the structure of FIG. 3 that has been annealed with a rapid thermal anneal process at 300 degrees C. for 30 seconds. Another plot 100 includes 30 nm of n+ ZnO:Al in accordance with the structure of FIG. 3 that has not been annealed.

As seen in the graph, plots 98 and 100 provide a greater current (electron density) in different voltage regimes. Depending on the application, rapid thermal annealing may be advantageous.

Figure 8:
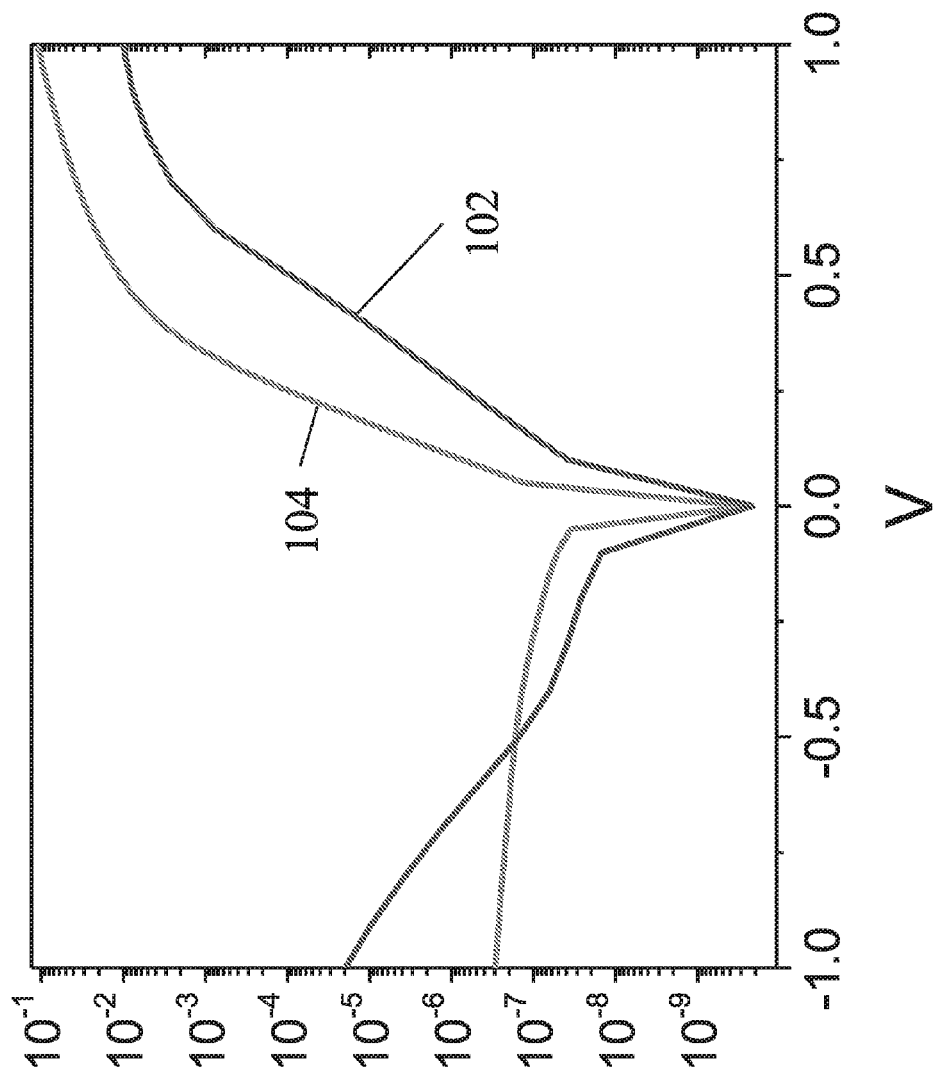
FIG. 8 is a current-voltage (I-V) graph plotting device current (amps) versus device voltage (volts) for a diode of FIG. 4 that includes n+ InGaAs and a diode of FIG. 4 that includes n+ ZnO:Al in accordance with the present principles.

Referring to FIG. 8, a current-voltage (I-V) graph plots device current (amps) versus device gate voltage (volts) for two devices. One plot 102 corresponds to a device that includes 100 nm of n+ InGaAs (specifically $In_{0.53}Ga_{0.47}As$) used for the n-doped layer in accordance with a conventional diode. Another plot 104 corresponds to a device formed by an interface layer 76 (FIG. 4) after a 100 nm AZO layer was deposited and then removed so the diode was formed solely by the interface layer. Plot 104 was measured based on a device that underwent the following: 1) 100 nm AZO was deposited on p-InGaAs, 2) AZO was removed (etch back), 3) Al/Au contact formed on the surface where AZO was removed. This surface contained heavily n-doped Zn-based oxide with In, Ga, Al dopants. The layer may be an InGaZnO (IGZO) with or without the AZO layer being removed in accordance with the structures of FIGS. 3 and 4.

As seen in the graph, plot 104 for n+ ZnO:Al provides a greater current (electron density) than the plot 102 for n+ InGaAs for positive voltages and comparable for moderate negative voltages. The greater current density in ZnO:Al provides better device performance. The on/off ratio of the device of plot 104 is improved by 3-4 orders of magnitude over that of the device for plot 102.

As before, for positive voltages and reverse voltages, an order of magnitude lower saturation current is achieved, which reduces leakage current in FETs by the same order of magnitude. Also in the reverse bias, an InGaAs n/p junction starts breaking down near 0.5 V while an AZO/InGaAs n/p junction (present principles) does not break down. This is because the ZnO band gap of 3.5 eV is much higher than the band gap of InGaAs. The substantially reduced reverse current provides better device performance.

Figure 9:
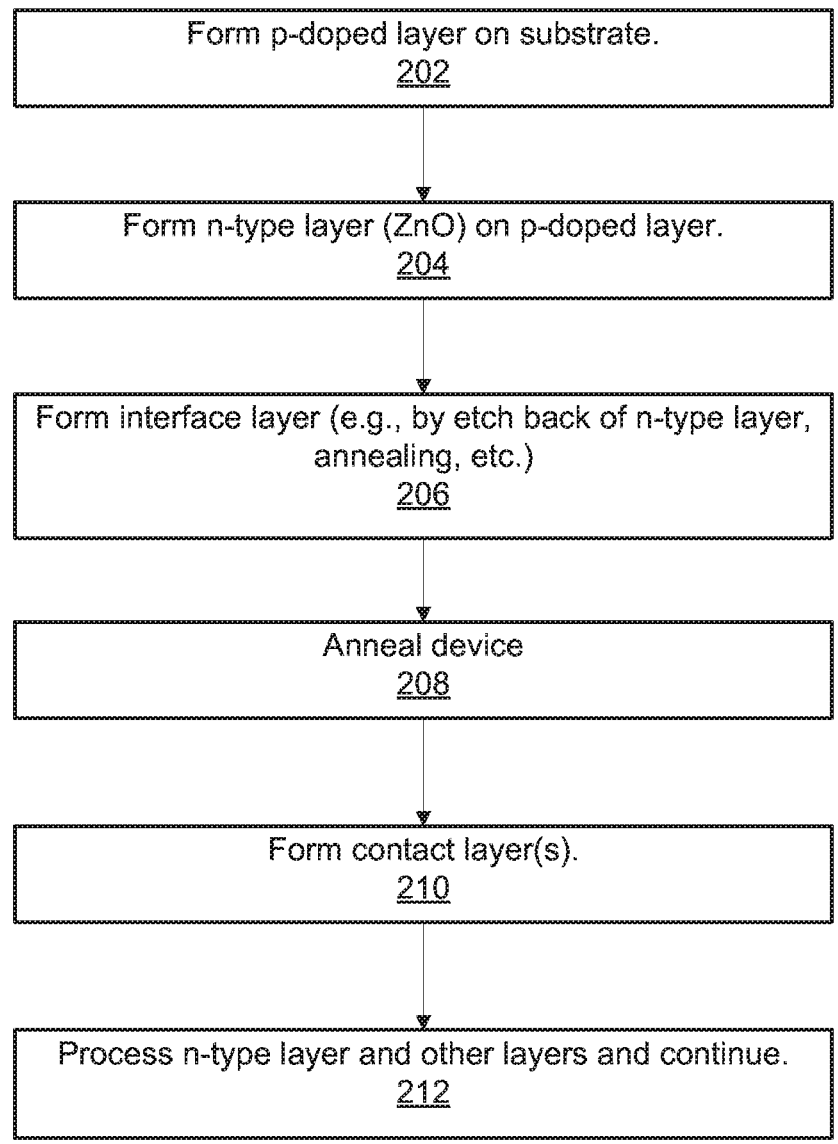
FIG. 9 is a block/flow diagram showing methods for forming a semiconductor device in accordance with illustrative embodiments.

Referring to FIG. 9, a method for forming a semiconductor device is shown in accordance with illustrative embodiments. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 202, a p-doped layer is grown or formed on a substrate, e.g., III-V substrate, Si, substrate, Ge substrate, etc. The p-doped layer preferably includes a III-V material. III-V materials may include, e.g., InP, InAs, AlAs, AN, GaN, InN, AlP, GaP, InP, AlAs, GaAs, InAs, etc. or tertiary compounds, e.g., InGaAs, AlGaAs, etc.

In block 204, an n-type layer is formed that includes a doped II-VI material, such as ZnO or ITO formed on the p-doped layer by employing an ALD process, MOCVD, sputtering, epitaxial growth, etc. The n-type layer is formed with (or will be processed to have) a carrier concentration of between about $1 \times 10^{21}$ cm$^{-3}$ to about $5 \times 10^{21}$ cm$^{-3}$, preferably about $3 \times 10^{21}$ cm$^{-3}$. This is due to the material and its formation processing. ALD is preferable and results in minimal surface damage to the underlying layers.

In one embodiment, in block 206, an interface layer may be formed between the p-doped layer and the n-type layer. The interface layer may be formed by etching back the n-type layer to the p-doped layer (e.g., removing the n-type material). The n-type material may be partially removed or removed down to the surface of the p-doped layer. The interface layer may be configured to transition an energy gap between the n-type layer and the p-doped layer. The interface may also be formed by annealing the device. A combination of processes may be employed to form the interface layer.

In block 208, the n-type layer may be annealed. This may be to form an interface layer or to improve device characteristics. For example, the anneal process may include a rapid thermal anneal (RTA) at between about 200 degrees C. to about 600 degrees C. for less than one minute. In one embodiment, the RTA includes a 300 degree C. anneal for about 30 seconds. If the anneal is to form the interface layer, the n-type layer may optionally be removed as described above after the anneal.

In block 210, a contact layer or contact layers are formed. The contact layers may include an aluminum contact layer formed on the n-type layer. The aluminum contact layer may be part of a bi-layer with another metal or metals deposited thereon. The contact layer may be employed as a dopant source to the n-type layer (and/or the interface layer). In block 212, the n-type layer (and other layers, e.g., contact layers) may be patterned or otherwise further processed to form a device. The device may include a transistor, diode, etc. Further processing may include forming a gate structure, metallizations, etc.

Having described preferred embodiments for a doped zinc oxide as n+ layer for semiconductor devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
a substrate;
a p-doped layer including a doped III-V material on the substrate; and
an n-type layer formed on or in the p-doped layer, the n-type-layer including ZnO, and an interface layer having materials formed from the n-type layer and the p-doped layer to form an electronic device.

2. The semiconductor device as recited in claim 1, wherein the n-type layer includes doped ZnO deposited by an atomic layer deposition or epitaxially grown by metal organic chemical vapor deposition.

3. The semiconductor device as recited in claim 1, wherein the n-type layer includes a carrier concentration of between about $1 \times 10^{21}$ cm$^{-3}$ to about $5 \times 10^{21}$ cm$^{-3}$.

4. The semiconductor device as recited in claim 1, wherein the n-type layer forms source and drain regions for a field effect transistor.

5. The semiconductor device as recited in claim 1, wherein the n-type layer forms a diode junction.

6. The semiconductor device as recited in claim 1, wherein the electronic device includes an on/off ratio of greater than $1 \times 10^6$.

7. The semiconductor device as recited in claim 1, further comprising an aluminum contact layer formed on the n-type layer.

8. The semiconductor device as recited in claim 1, further comprising a bi-layer contact layer, wherein the hi-layer contact layer includes a conductive liner and a conductive fill material different than the conductive liner.

9. A semiconductor device, comprising:
a substrate;
a p-doped layer including a doped MA' material on the substrate; and
a doped ZnO formed as an n-type layer on or in the p-doped layer to form an electronic device, wherein the n-type layer includes an interface layer includes materials formed from the n-type layer and the p-doped layer and the n-type layer includes a carrier concentration of between about $1 \times 10^{21}$ cm$^{-3}$ to about $5 \times 10^{21}$ cm$^{-3}$.

10. The semiconductor device as recited in claim 9, wherein the n-type layer forms source and drain regions for a field effect transistor.

11. The semiconductor device as recited in claim 9, wherein the n-type layer forms a diode junction.

12. The semiconductor device as recited in claim 9, wherein the electronic device includes an on/off ratio of greater than $1 \times 10^6$.

13. The semiconductor device as recited in claim 9, further comprising an aluminum contact layer formed on the n-type layer.

14. The semiconductor device as recited in claim 9, further comprising a bi-layer contact layer, wherein the bi-layer contact layer includes a conductive liner and a conductive fill material different than the conductive liner.

15. A method for forming a semiconductor device, comprising:
forming a p-doped layer including a doped III-V material on a substrate;

forming an n-type layer including ZnO on or in the p-doped layer, wherein then-type layer includes an interface layer including materials from the n-type layer and the p-doped layer; and processing the n-type layer to form a device.

16. The method as recited in claim 15, further comprising:

annealing the n-type layer to form the interface layer between the p-doped layer and the n-type layer; and removing the n-type layer.

17. The method device as recited in claim 15, further comprising forming the interface layer between the n-type layer and the p-doped layer by etching back the n-type layer to the p-doped layer.

18. The method device as recited in claim 15, further comprising forming a bi-layer contact layer, wherein the bi-layer contact layer includes a conductive liner and a conductive fill material different than the conductive liner.

* * * * *